(12) United States Patent
Wada et al.

(10) Patent No.: US 10,403,620 B2
(45) Date of Patent: Sep. 3, 2019

(54) SEMICONDUCTOR DEVICE

(71) Applicant: HITACHI AUTOMOTIVE SYSTEMS, LTD., Hitachinaka-shi, Ibaraki (JP)

(72) Inventors: Shinichirou Wada, Tokyo (JP); Katsumi Ikegaya, Hitachinaka (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 0 days.

(21) Appl. No.: 16/075,009

(22) PCT Filed: Jan. 12, 2017

(86) PCT No.: PCT/JP2017/000701
§ 371 (c)(1),
(2) Date: Aug. 2, 2018

(87) PCT Pub. No.: WO2017/145542
PCT Pub. Date: Aug. 31, 2017

(65) Prior Publication Data
US 2019/0043851 A1 Feb. 7, 2019

(30) Foreign Application Priority Data
Feb. 24, 2016 (JP) ................................. 2016-032697

(51) Int. Cl.
*H01L 27/02* (2006.01)
*H01L 27/12* (2006.01)
(Continued)

(52) U.S. Cl.
CPC .... *H01L 27/0207* (2013.01); *H01L 21/76224* (2013.01); *H01L 27/088* (2013.01);
(Continued)

(58) Field of Classification Search
CPC .......................... H01L 27/0211; H01L 27/0266
See application file for complete search history.

(56) References Cited

U.S. PATENT DOCUMENTS

| 2006/0022298 A1 | 2/2006 | Shiraishi et al. |
| 2006/0138460 A1 | 6/2006 | Sasaki et al. |
| (Continued) | | |

FOREIGN PATENT DOCUMENTS

| JP | H06-342803 A | 12/1994 |
| JP | H11-214710 A | 8/1999 |
| (Continued) | | |

OTHER PUBLICATIONS

International Search Report with English translation and Written Opinion issued in corresponding application No. PCT/JP2017/000701 dated May 16, 2017.

*Primary Examiner* — George R Fourson, III
(74) *Attorney, Agent, or Firm* — Foley & Lardner LLP

(57) ABSTRACT

To provide a semiconductor device capable of restricting the substrate bias effect of a high-side transistor while enhancing the heat radiation property of a low-side transistor. A high-side NMOS transistor 101 is formed in a region S1 on the surface of a SOI substrate 30. A trench 41 surrounds the high-side NMOS transistor 101. $SiO_2$ (first insulator) embeds the trench 41. A low-side NMOS transistor 102 is formed in a region S2 on the surface of the SOI substrate 30 around the trench 41. The side face Sf connecting the region S2 forming the low-side NMOS transistor 102 therein and the backside of the SOI substrate 30 is exposed.

10 Claims, 4 Drawing Sheets

(51) Int. Cl.
*H01L 27/088* (2006.01)
*H01L 21/762* (2006.01)
*H03K 17/082* (2006.01)
*H01L 29/739* (2006.01)

(52) U.S. Cl.
CPC ...... *H01L 27/1203* (2013.01); *H01L 27/0211* (2013.01); *H01L 27/0266* (2013.01); *H01L 29/7393* (2013.01); *H03K 17/0822* (2013.01)

(56) References Cited

U.S. PATENT DOCUMENTS

| | | | | |
|---|---|---|---|---|
| 2006/0231904 | A1* | 10/2006 | Kocon | H01L 21/823487 257/391 |
| 2009/0273099 | A1* | 11/2009 | Matsunaga | H01L 27/0207 257/786 |
| 2010/0078676 | A1 | 4/2010 | Miyoshi et al. | |
| 2011/0006361 | A1* | 1/2011 | Darwish | H01L 21/823418 257/329 |
| 2013/0147540 | A1* | 6/2013 | Wu | H01L 27/0883 327/382 |
| 2013/0299871 | A1* | 11/2013 | Mauder | H01L 29/7394 257/140 |
| 2014/0167069 | A1* | 6/2014 | Vielemeyer | H01L 27/0629 257/77 |
| 2014/0210002 | A1* | 7/2014 | Sawase | H01L 29/7825 257/334 |
| 2016/0268423 | A1* | 9/2016 | Koepp | H01L 29/7825 |

FOREIGN PATENT DOCUMENTS

| | | |
|---|---|---|
| JP | 2006-049341 A | 2/2006 |
| JP | 2006-186159 A | 7/2006 |
| JP | 2008-035067 A | 2/2008 |
| JP | 2008-182122 A | 8/2008 |
| JP | 2008-244094 A | 10/2008 |
| JP | 2010-080803 A | 4/2010 |
| WO | WO-2014/188651 A1 | 11/2014 |
| WO | WO-2016/017068 A1 | 2/2016 |

\* cited by examiner

SEMICONDUCTOR DEVICE

TECHNICAL FIELD

The present invention relates to a semiconductor device.

BACKGROUND ART

A semiconductor device configuring a drive circuit such as solenoid load mounted on a vehicle-mounted electrical control unit (ECU) is required to have a current drive capability with a high breakdown voltage of 30 V or more and a high ampere order and to absorb current energy generated at an output terminal in order to prevent erroneous operation or destruction.

Thus, there is known, for example, a technique in which an active clamp circuit is provided between the gate and the drain of a power transistor at the output stage and a gate voltage of the power transistor is increased to turn on the transistor (active clamp operation) when a voltage over an absolute maximum rating is generated at an output terminal due to application of a large inductive current noise, thereby absorbing current noise generated at the output terminal in the ground (see PTL 1, for example). Further, with the technique disclosed in PTL 1, also when a reflux path for letting a current flow from a solenoid load toward the high side is shut down during an abnormality, the active clamp operation is performed to absorb load energy, thereby preventing the low-side power transistor from being damaged.

Current energy (thermal destruction energy) capable of being absorbed by the power transistor during the active clamp operation is determined under the condition of generation of thermal runaway due to self-heating of the transistor, and its value can be generally increased by increasing the size of the transistor. However, there is a problem that an increase in size of the transistor can cause an increase in chip cost.

On the other hand, the power transistor with a relatively large size is different in its radiation property at a uniform current density in the transistor, and thus a large difference in temperature is caused between in the center region and in the surrounding region. That is, the temperature is higher and the thermal runaway is easily caused in the center region with low radiation property while the temperature is lower due to the radiation effect in the surrounding region. Consequently, there is a problem that the thermal destruction energy of the transistor cannot be increased according to the increase in size.

There are disclosed techniques for making a distribution of temperatures uniform in a transistor for the above problem (see PTL 2, for example). One of them is a method for increasing intervals of active regions of a transistor arranged in parallel in the center region and decreasing them in the surrounding region, and the other of them is a method for further reducing input power in the center region than input power in the surrounding region. With either method, consumed power per unit area is decreased from the surrounding region toward the center region thereby to make the distribution of temperatures uniform in the transistor, consequently enhancing thermal destruction energy of the transistor.

Further, there is disclosed a technique for providing a non-active region in the center region in a power transistor and forming a heat radiation electrode on the non-active region (see PTL 3, for example). The center region with higher temperature is deactivated, thereby lowering the temperature in the transistor and enhancing uniformity of the temperatures. Further, heat is radiated to the outside of the semiconductor via the heat radiation electrode, thereby further lowering the temperature. Consequently, thermal destruction energy of the transistor can be similarly increased.

Further, there is disclosed a technique in which high-side transistors and low-side transistors are alternately arranged and the source electrode of a high-side transistor and the drain electrode of a low-side transistor are assumed as one common electrode in order to reduce parasitic inductance between the transistors (see PTL 4, for example). With the technique, heat generated in the low-side transistors can be radiated to the high-side transistor regions, thereby increasing thermal destruction energy of the low-side transistors without increasing the chip size of the output circuit configured of the high-side transistors and the low-side transistors.

CITATION LIST

Patent Literature

PTL 1: JP 2008-35067 A
PTL 2: JP 6-342803 A
PTL 3: JP 2008-182122 A
PTL 4: International Publication 2014/188651

SUMMARY OF INVENTION

Technical Problem

With either technique described in PTL 2, however, the current performance of the transistor in the center region is restricted such that the consumed power density of the transistor decreases from the surrounding region toward the center region. Thus, there is a problem that the performance per area of the transistor lowers in the center region during the normal operation. Further, there is a problem that the arrangement design and control of the transistors are complicated in order to restrict the current performance of the transistor in the center region.

Further, with the method described in PTL 3, the chip size is larger and the cost is higher according to the non-active region at the same transistor performance during the normal operation than when the non-active region is not provided.

Further, with the method described in PTL 4, heat generated in the low-side transistors can be radiated to the adjacent high-side transistors while restricting an increase in size, and a certain temperature lowering effect is obtained, but the direction in which the high-side transistors and the low-side transistors are arranged in parallel is limited only in the gate arrangement direction. Thus, the configuration is not necessarily optimized in order to enhance the heat radiation property of the low-side transistors.

Further, with the method described in PTL 4, the source electrode of a high-side MOS transistor and the drain electrode of a low-side MOS transistor are assumed as the same electrode, and thus the well layers of the high-side and low-side transistors are inevitably set at the same potential. Thus, there arise a problem that the substrate bias effect that a reverse bias corresponding to the power voltage is applied between the source and the well is caused while the high-side MOS transistors are on, and the current performance of the high-side transistors lowers.

In this way, with the conventional techniques, the substrate bias effect of a high-side transistor cannot be restricted while enhancing the heat radiation property of a low-side transistor.

It is an object of the present invention to provide a semiconductor device capable of restricting the substrate bias effect of a high-side transistor while enhancing the heat radiation property of a low-side transistor.

Solution to Problem

To achieve the above object, the present invention includes: a semiconductor substrate; a high-side transistor formed in a first region on the surface of the semiconductor substrate; a trench surrounding the high-side transistor; a first insulator embedding the trench; and a low-side transistor formed in a second region on the surface of the semiconductor substrate around the trench, wherein the side face connecting the second region forming the low-side transistor therein and the backside of the semiconductor substrate is exposed.

Further, to achieve the above object, the present invention includes: a semiconductor substrate; a high-side transistor formed in a first region on the surface of the semiconductor substrate; a trench surrounding the high-side transistor; a first insulator embedding the trench; and a low-side transistor formed in a second region on the surface of the semiconductor substrate around the trench, wherein the total area of the second region forming the low-side transistor therein is larger than the total area of the first region forming the high-side transistor therein.

Advantageous Effects of Invention

According to the present invention, it is possible to restrict the substrate bias effect of a high-side transistor while enhancing the heat radiation property of a low-side transistor. Other objects, configurations, and effects will be more apparent in the following description of embodiments.

DESCRIPTION OF EMBODIMENTS

Figure 1A:
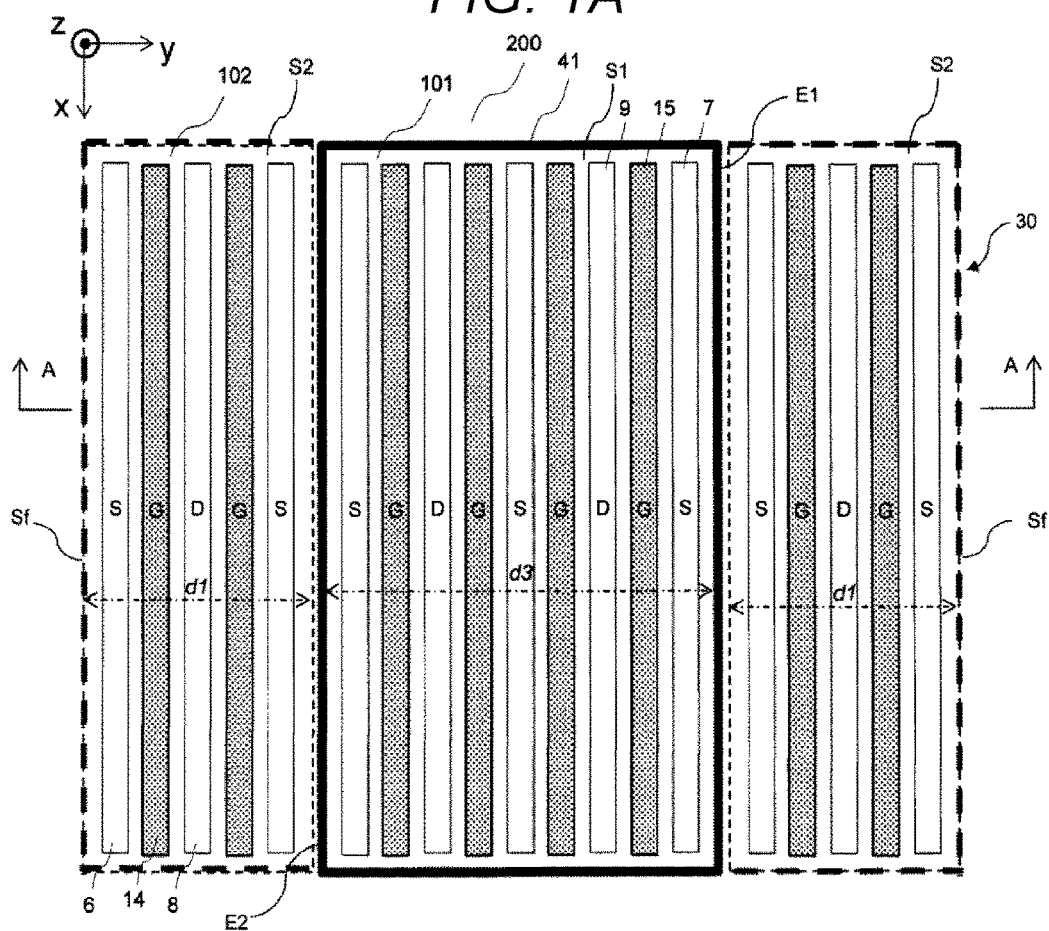
FIG. 1A is a plan view schematically illustrating a semiconductor device according to a first embodiment.

The configuration and operational effects of a semiconductor device according to a first to fourth embodiments of the present invention will be described below with reference to the drawings. Additionally, the same reference numerals denote the same parts in each figure. The semiconductor device according to the embodiments of the present invention is directed for achieving the following first to third objects, for example, though partially the same as the above object.

The first object is to increase temperature uniformity and heat radiation property of low-side transistors and to increase thermal destruction energy during an active clamp operation by giving a degree of freedom to an arrangement of the low-side transistors for high-side transistors without increasing a chip size and lowering a current performance per area of the high-side transistors during a normal operation.

The second object is to enhance the heat radiation property of the low-side transistors and to further increase the thermal destruction energy of the low-side transistors than the thermal destruction energy of the high-side transistors during the active clamp operation without increasing a chip size of a drive circuit configured of the high-side transistors and low-side transistors of high breakdown voltage.

The third object is to prevent a reduction in current performance due to the substrate bias effect when the high-side transistors are on by mutually isolating the well layers of the high-side MOS transistors and the low-side MOS transistors and setting the well potential of the high-side transistors at the same potential as the source potential.

First Embodiment

Figure 1B:
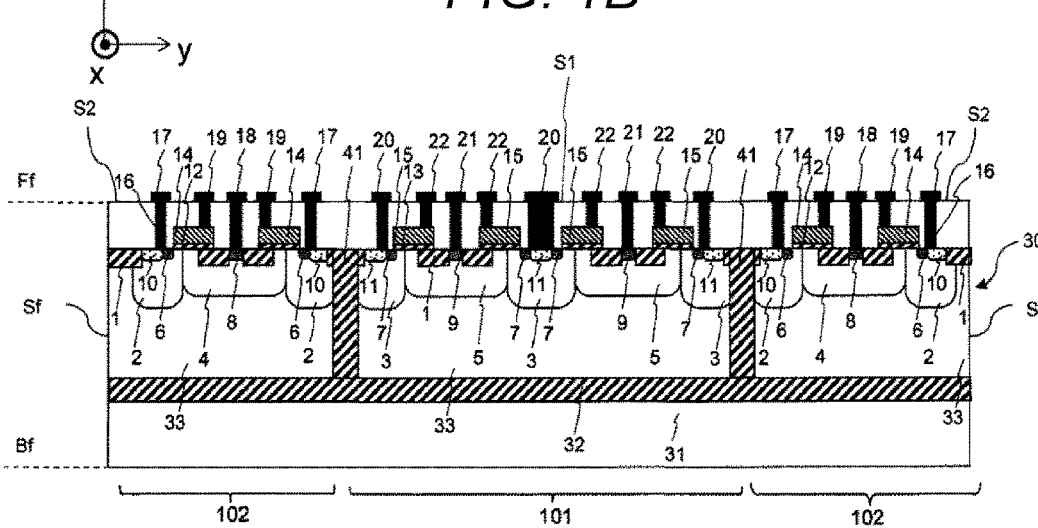
FIG. 1B is a longitudinal cross-section view in a region indicated by an arrow A of FIG. 1A.

FIG. 1 illustrates an embodiment of the present invention, which will be described below. FIG. 1A is a plan view schematically illustrating a semiconductor device according to a first embodiment. Further, FIG. 1B is a longitudinal cross-section view in a region indicated by an arrow A of FIG. 1A.

As illustrated in FIG. 1A, a semiconductor device 200 consists of low-side NMOS transistors 102 and a high-side NMOS transistor 101 surrounded by a trench 41, where the low-side NMOS transistors 102 are adjacently arranged on both sides of the high-side NMOS transistor 101 surrounded by the trench 41.

As illustrated in FIG. 1B, the trench 41 contacts with a $SiO_2$ layer 32 as a silicon on insulator (SOI) substrate in order to isolate a P-well layer 3 of the high-side NMOS transistor 101 and a P-well layer 2 of the low-side NMOS transistor 102, and is embedded with a $SiO_2$ insulative layer therein in order to obtain dielectric breakdown at a power voltage or more. Further, as illustrated in FIG. 1A, each transistor is configured of a group of transverse NMOS transistors with the same characteristics in which sources 6, 7, gates 14, 15, and drains 8, 9 are arranged in parallel.

In other words, the high-side NMOS transistor 101 (high-side transistor) is formed in a region S1 (first region) on the surface Ff of the SOI substrate 30 (semiconductor substrate). The trench 41 surrounds the high-side NMOS transistor 101. $SiO_2$ (first insulator) embeds the trench 41. The low-side NMOS transistors 102 (low-side transistors) are formed in the regions S2 (second regions) on the surface Ff of the SOI substrate 30 around the trench 41. As illustrated in FIG. 1B, the side face Sf connecting the regions S2 (second regions) forming the low-side NMOS transistors 102 therein and the backside Bf of the SOI substrate 30 is exposed.

That is, the low-side NMOS transistors 102 are not surrounded by the trench 41.

The region S1 (first region) is quadrangular in FIG. 1A. The low-side NMOS transistors 102 (low-side transistors) are formed in the two regions S2 adjacent to a pair of opposite sides E1 and E2 of the region S1, respectively.

As illustrated in FIG. 1B, the SOI substrate 30 (semiconductor substrate) is configured in which a S1 support substrate 31 (support substrate), the $SiO_2$ layer 32 (second insulator), and a P-type semiconductor layer 33 (P-type semiconductor) are laminated. $SiO_2$ (first insulator) embedded in the trench 41 contacts with the $SiO_2$ layer 32 (second insulator). Thereby, the substrate bias effect can be accurately prevented.

Figure 2:
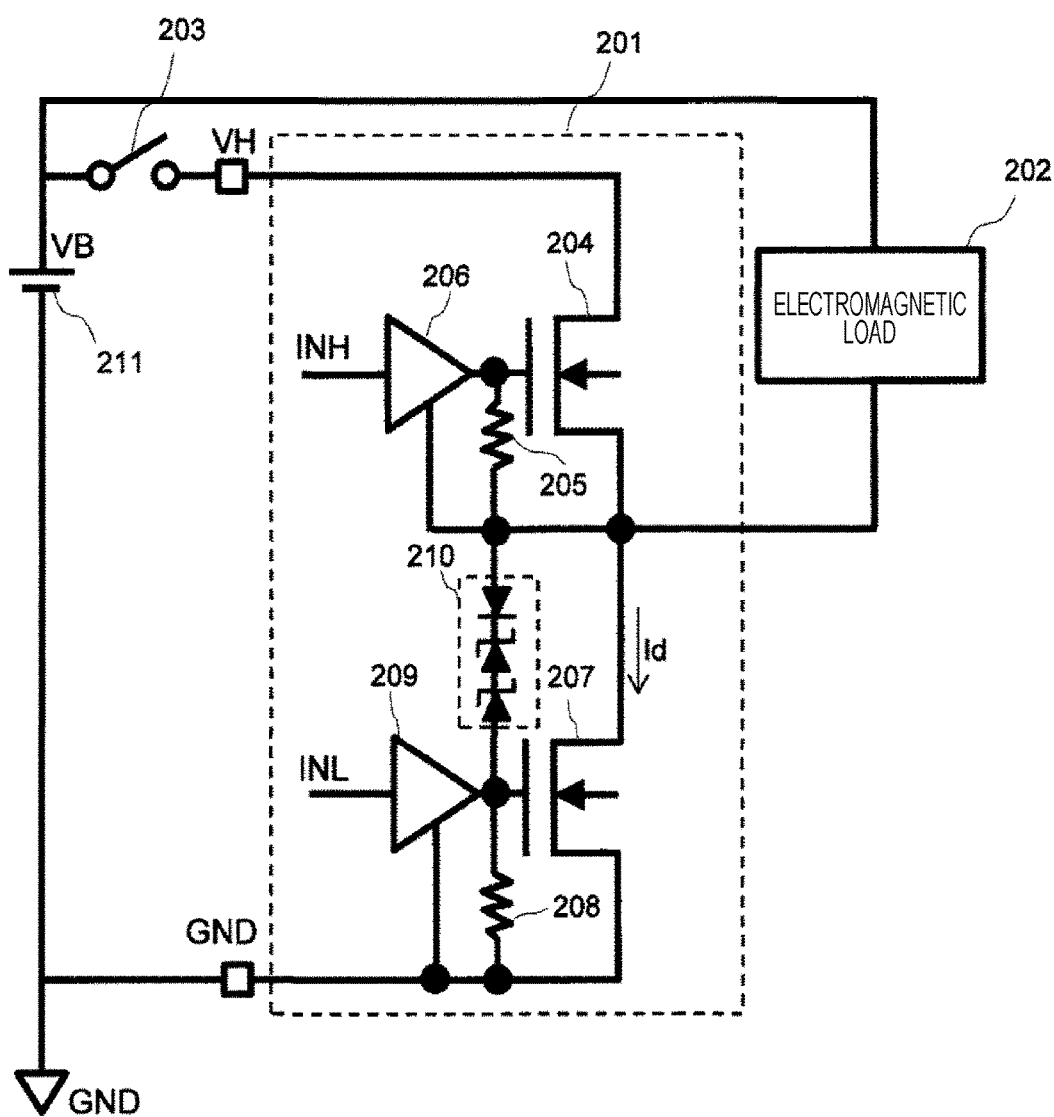
FIG. 2 is a diagram for explaining an active clamp operation of a current drive circuit system including the semiconductor device illustrated in FIG. 1A.

An active clamp operation of the low-side transistors will be described herein. FIG. 2 illustrates an entire drive circuit system configured of a current drive circuit 201 including an active clamp circuit 210, an electromagnetic load 202, a power supply 211, and a switch 203. The electromagnetic load 202 is connected to the output of the drive circuit and the power supply 211. During the normal operation, the switch 203 is on, and the current drive circuit 201 is supplied with power of 14 V from the power supply VB211, for example.

A reflux current as load drive current flows to GND from the power supply VB211 via the electromagnetic load 202 when a low-side transistor 207 is on, and flows to the power supply via a high-side transistor 204 when the low-side transistor 207 is off. Herein, if the switch 203 is disconnected due to an abnormality and power is not supplied when the low-side transistor 207 is switched from on to off, the reflux current normally flowing from the electromagnetic load via the high-side transistor 204 flows nowhere, and thus the potential of the output terminal increases.

At this time, a current starts flowing in a Zener diode (the active clamp circuit 210) connected to the gate and the drain of the low-side transistor 207 when the potential of the output terminal reaches a certain voltage (clamp voltage) such as 35 V in order to prevent the low-side transistor 207 from being broken down. The current flows through a resistor 208 connected between the gate and the source, and thus the low-side transistor 207 increases in its gate voltage, and a drain current $I_d$ flows therein.

The drain current $I_d$ linearly decreases such that a sum of electromotive power ($-L \cdot dI_d/dt$) of the electromagnetic load and the power supply VB takes the clamp voltage, and energy calculated by temporal integration of a product of the drain current $I_d$ and the clamp voltage is consumed in the low-side transistor 207. The amount of energy is 20 mJ at an electromagnetic load of 13 mH and a drive current of 2 A, and the low-side transistor 207 generates heat due to the energy consumption. At this time, if the temperature of the transistor reaches a certain threshold or more, thermal runaway is caused in the transistor and leads to thermal destruction, and thus the temperature of the transistor needs to be restricted in order to prevent the thermal destruction. On the other hand, such much energy consumption is not caused in the high-side transistor 204.

As illustrated in FIG. 1A, if a low-side NMOS transistor 102 is divided into two and they are adjacently arranged on both sides of the high-side NMOS transistor 101, the surrounding regions as heat radiation regions of the low-side NMOS transistors 102 are larger than that of the high-side NMOS transistor 101. Thus, the heat radiation property of the low-side NMOS transistors 102 can be higher than that of the high-side NMOS transistor 101.

For example, the length d1 of the short side of the low-side NMOS transistor 102 is 50 μm, the length d3 of the short side of the high-side transistor is 90 μm, and the width of the trench 41 is 1 μm. At this time, an increase in chip size due to insertion of the trench 41 can be restricted to about 1%. A smaller number of trenches 41 can restrict an influence on the chip size, and thus a smaller number of high-side NMOS transistors 101 is preferably employed.

In other words, the widths d1 of the two regions S2 adjacent to a pair of opposite sides E1 and E2 of the region S1, respectively, are equal in the direction (in the y-axis direction in FIG. 1A) in which the region S1 (first region) and the regions S2 (second regions) are arranged. Thereby, the heat radiation properties of the two regions S2 can be made uniform during the active clamp operation.

Further, the total area of the low-side NMOS transistors 102 is larger than the total area of the high-side NMOS transistor 101.

In other words, the total area of the regions S2 (second regions) forming the low-side NMOS transistors 102 (low-side transistors) therein is larger than the total area of the region S1 (first region) forming the high-side NMOS transistor 101 (high-side transistor) therein.

If the total area of the low-side NMOS transistors 102 is increased, the power density per unit area can be lowered, thereby lowering the temperature during the active clamp operation.

On the other hand, the active clamp operation state is not caused in the high-side NMOS transistor 101, and thus thermal destruction due to generated heat does not need to be considered. Therefore, the high-side NMOS transistor 101 can be designed such that the current performance meets the specification during the normal operation, and can be smaller in its area than the low-side NMOS transistors 102.

Further, the trench 41 is not present around the low-side NMOS transistors 102 except where they contact with the high-side NMOS transistor 101. The source 6 and the P-well layer 2 of the low-side NMOS transistor 102 are set at the GND potential, or at the same potential as the P-type semiconductor layer 33, and thus do not need to be separated by the trench. The trench 41, which is higher in thermal resistance than the P-type semiconductor layer 33, is not provided, thereby enhancing the heat radiation property to the surroundings in the semiconductor device 200.

Consequently, the thermal destruction energy can be increased during the active clamp operation of the low-side NMOS transistors 102.

In other words, the thermal destruction energy of the low-side NMOS transistors 102 (low-side transistors) is higher than the thermal destruction energy of the high-side NMOS transistor 101 (high-side transistor).

Further, each transistor is configured in which N-type drain drift layers 4, 5 and P-well layers 2, 3 are formed on the P-type semiconductor layer 33 isolated from the Si support substrate 31. The P-well layer 2 of the low-side NMOS transistor 102 is isolated from the P-well layer 3 of the high-side NMOS transistor 101 by the trench 41. Thus, the P-well layer 3 of the high-side NMOS transistor 101 can be electrically connected at the same potential at the source 7 and a source electrode 20.

Consequently, a reduction in current performance of the high-side NMOS transistor 101 due to the substrate bias effect of the high-side NMOS transistor 101 can be eliminated. Additionally, the NMOS transistors are described by way of example according to the present embodiment, but insulated gate bipolar transistors (IGBT) formed on the P-type semiconductor layer 33 can be employed. Further, though not illustrated, the source electrode 20 of the high-side NMOS transistor 101 is connected to a drain electrode 18 of the low-side NMOS transistor 102 via a wiring layer to be an output terminal.

As described above, according to the present embodiment, the side faces of the low-side transistors are exposed, thereby enhancing the heat radiation property of the low-side transistors. Further, the high-side transistor is surrounded by the trench, thereby restricting the substrate bias effect of the high-side transistor.

Second Embodiment

Figure 3:
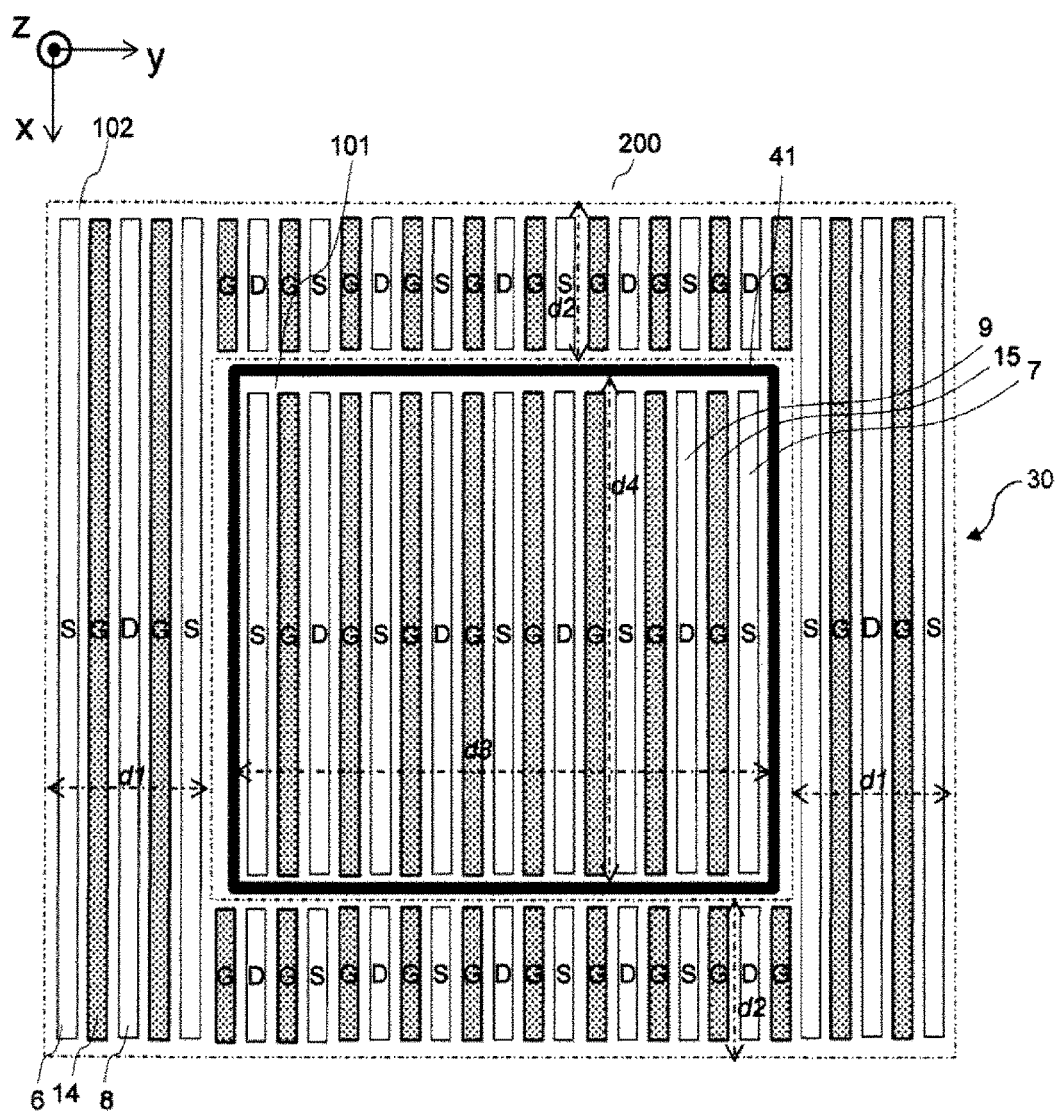
FIG. 3 is a plan view schematically illustrating the semiconductor device according to a second embodiment.

FIG. 3 is a plan view schematically illustrating the semiconductor device 200 according to a second embodiment of the present invention. The semiconductor device 200 consists of the high-side NMOS transistor 101 surrounded by the trench 41 and the low-side NMOS transistor 102, where the low-side NMOS transistor 102 is arranged adjacent to and surrounds the high-side NMOS transistor 101.

In other words, the low-side NMOS transistor 102 (low-side transistor) is arranged to surround the trench 41.

The surrounding heat radiation region of the low-side NMOS transistor 102 is assumed as the entire external periphery region of the high-side NMOS transistor 101 and the low-side NMOS transistor 102, thereby further enhancing the heat radiation property than in the first embodiment. Further, if the area of the low-side NMOS transistor 102 is the same as in the first embodiment, the widths d1 and d2 of the low-side NMOS transistor 102 can be made smaller, thereby further enhancing uniformity of the temperature in the transistor and the heat radiation property. Additionally, it is desirable that the widths d1 and d2 of the low-side NMOS transistor 102 are equal for a smaller difference in temperature in the transistor.

Further, the area of the low-side NMOS transistor 102 is larger than the area of the high-side NMOS transistor 101 and the energy per area in the low-side transistor is reduced during the active clamp operation, thereby lowering the temperature in the transistor. Consequently, the thermal destruction energy of the low-side transistor can be increased.

Third Embodiment

Figure 4:
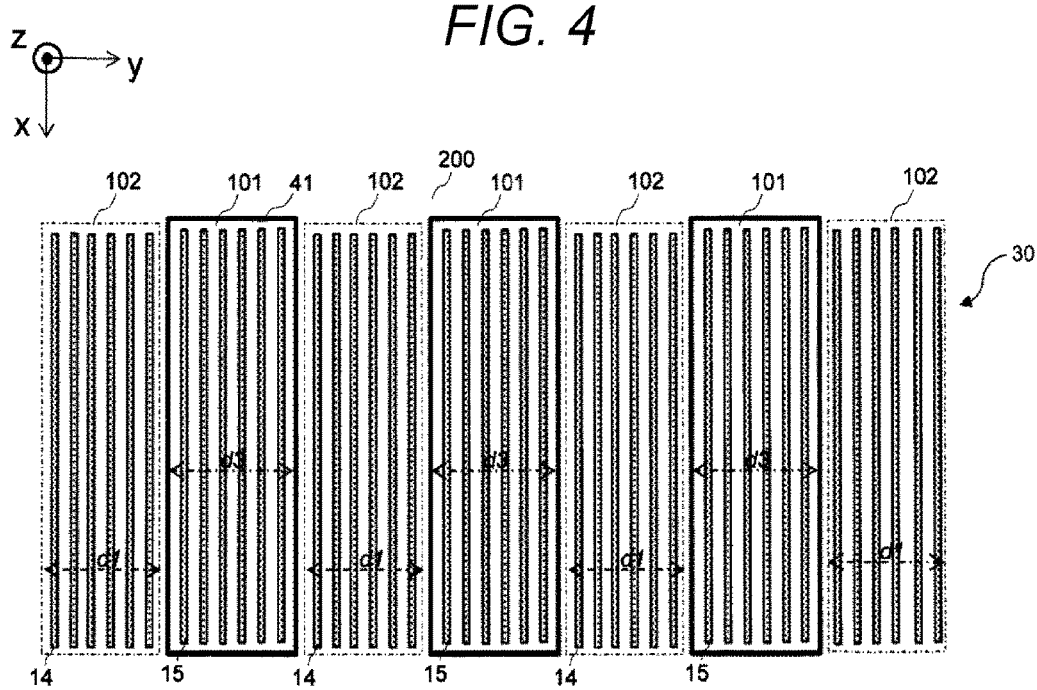
FIG. 4 is a plan view schematically illustrating the semiconductor device according to a third embodiment.

FIG. 4 is a plan view schematically illustrating the semiconductor device 200 according to a third embodiment of the present invention. The present embodiment is different from the first embodiment in that a low-side NMOS transistor 102 is divided into more parts. The sources and the drains are not illustrated, but they are arranged adjacent to the gates 14 and 15.

Each low-side NMOS transistor 102 is arranged adjacent to the high-side NMOS transistors 101 surrounded by the trenches 41, and the number thereof is higher than the number of high-side NMOS transistors 101. A low-side NMOS transistor 102 is divided into two or more regions, thereby reducing the length d1 of the short side of the low-side NMOS transistors 102 and thereby securing uniformity of the temperature in the transistor.

Further, the surrounding region to which the low-side NMOS transistors 102 radiate heat is increased, thereby lowering the temperature. With a higher number of divisions, the entire chip size increases according to the trenches 41 at the boundaries between the high-side NMOS transistor 101 and the low-side NMOS transistor 102, and thus it is desirable that the lengths d1 and d3 of the short sides of the respective transistors are sufficiently higher than the width of the trench.

For example, assuming d1 and d3 of 30 μm or more when the width of the trench is 1 μm, an influence due to the increase in size can be assumed at about 3%. The total area of the transistors can be increased while keeping uniformity of the temperature in the transistors by increasing the length of the long side while keeping the length d1 of the short side of the transistors other than dividing the low-side NMOS transistor 102 into more parts.

Fourth Embodiment

Figure 5:
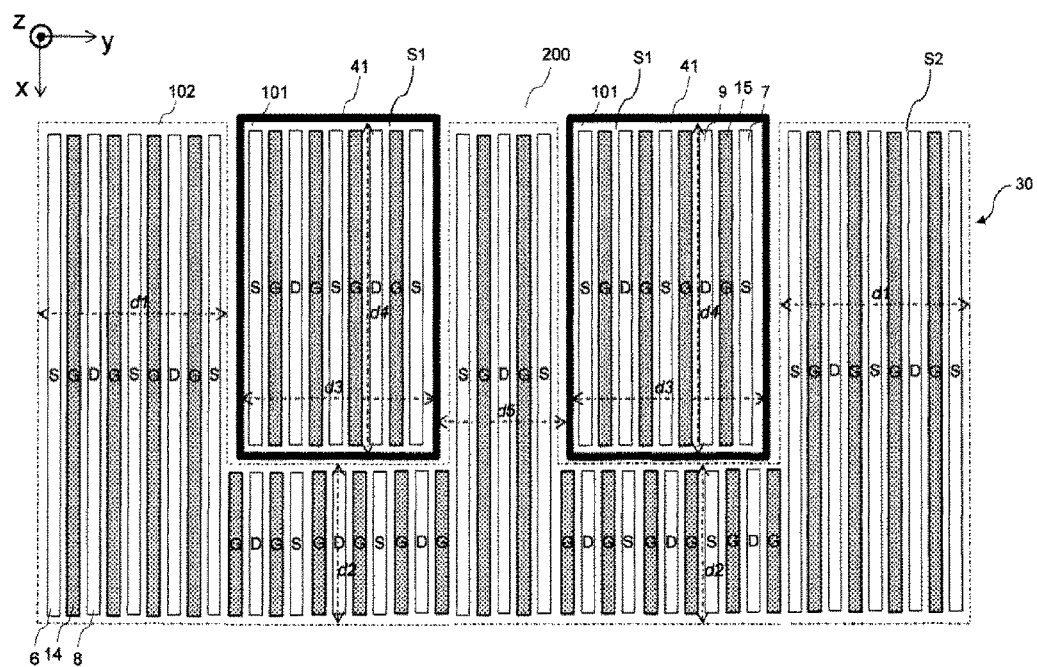
FIG. 5 is a plan view schematically illustrating the semiconductor device according to a fourth embodiment.

FIG. 5 is a plan view schematically illustrating the semiconductor device 200 according to a fourth embodiment of the present invention. The semiconductor device 200 consists of two high-side NMOS transistors 101 and the low-side NMOS transistor 102 surrounding them in three directions.

In other words, the trenches 41 surrounding the regions S1 in which the high-side NMOS transistors 101 (high-side transistors) are formed, respectively, contact with one end of the SOI substrate 30 (semiconductor substrate).

As compared with the second embodiment in which the low-side NMOS transistor 102 surrounds the high-side NMOS transistor 101 in four directions, the heat radiation property of the low-side NMOS transistor 102 is lower but there is an advantage that the wirings of the gates 15 of the low-side NMOS transistor 102 are more easily drawn.

Heat generated in the low-side NMOS transistor 102 is radiated to the surrounding region of the high-side NMOS transistors 101 and the semiconductor device 200. Herein, it is desirable that the widths d1 and d2 of the low-side NMOS transistor 102 in the external periphery region are equal for a smaller difference in temperature in the transistor, but the width d5 of the low-side NMOS transistor 102 on both sides which the high-side NMOS transistors 101 are present is smaller than the width d1 of the low-side NMOS transistor 102 only on either side of which the high-side NMOS transistor 101 is present.

In other words, the high-side NMOS transistors 101 (high-side transistors) are formed in the two mutually-separated regions S1. The trenches 41 surround the regions S1 forming the high-side NMOS transistors 101 therein, respectively. The distance (the width d5) between the adjacent trenches 41 is smaller than the distance (the width d1) between the trench 41 and the SOI substrate 30 (semiconductor substrate) in the direction (in the y-axis direction of FIG. 5) in which the regions S1 forming the high-side NMOS transistors 101 therein are arranged.

The thermal resistance of the trenches surrounding the high-side transistors is high and thus the heat radiation property is lower in the low-side transistor region on both sides of which the high-side NMOS transistors 101 are present, thereby increasing uniformity of the temperature of the entire low-side transistor by reducing the region width and the amount of generated heat. Consequently, the thermal destruction energy of the low-side transistor can be increased.

The present invention is not limited to the above embodiments, and includes many variants. For example, the above embodiments have been described in detail for simply describing the present invention, and the present invention is not necessarily limited to one including all the aforementioned components. Further, part of the components of an embodiment may be replaced with the components of other embodiment, or the components of an embodiment may be added with the components of other embodiment. Furthermore, part of the components of each embodiment can be added with, deleted, or replaced with other components.

The high-side transistors are arranged in parallel in two places in the gate arrangement direction in the drawings, but may be arranged in three or more places, or arranged vertical to the gate arrangement direction.

The low-side NMOS transistor 102 (low-side transistor) and the high-side NMOS transistor 101 (high-side transistor) according to the above embodiments may have a breakdown voltage of 30 V or more. Thereby, the semiconductor device 200 can drive a solenoid for vehicle as power transistor requiring a high breakdown voltage.

The embodiments of the present invention may take the following forms.

(1) A semiconductor device which is a circuit including a semiconductor substrate and a group of high-side and low-side transistors provided on the semiconductor substrate, in which a high-side transistor region surrounded by a trench is arranged between low-side transistor regions, and the trench is arranged between the high-side transistor region and the low-side transistor regions.

With the configuration, heat generated in the low-side transistors can be radiated to the surrounding region during the active clamp operation. Further, the low-side transistor regions are provided in the external periphery region of the drive circuit, thereby further enhancing the heat radiation property than the high-side transistor region. Further, the high-side transistor is separated from the low-side transistors by the trench at a small separation distance, thereby freely arranging the low-side transistors relative to the high-side transistor for optimum heat radiation of the low-side transistors while restricting an increase in the chip size. Further, the well layers of the low-side and high-side MOS transistors are mutually isolated by the trench, thereby resolving a problem of a reduction in current performance of the high-side transistor due to the substrate bias effect.

(2) The semiconductor device according to (1) in which the total area of the low-side transistor regions is larger than the total area of the high-side transistor region.

With the configuration, the total area of the low-side transistor regions can be increased without increasing the total area of an output transistor configured of the low-side transistors and the high-side transistor, thereby further lowering the temperature of the low-side transistor regions during the active clamp operation.

(3) The semiconductor device according to (1) or (2) in which the low-side transistor region provided on the semiconductor substrate is arranged to surround the high-side transistor region.

With the configuration, heat generated in the low-side transistor region during the active clamp operation can be radiated to the external periphery region of the low-side transistor and the high-side transistor region, thereby restricting an increase in area of the output transistor configured of the low-side transistor and the high-side transistor and forming the low-side transistor excellent in the heat radiation property.

(4) The semiconductor device according to (1) or (2) in which the low-side transistor regions are adjacently arranged at least on both sides of the high-side transistor region.

With the configuration, the region to which heat is radiated from the low-side transistors can be made larger than that of the high-side transistor while restricting an increase in area of the output transistor configured of the low-side transistors and the high-side transistor, and an increase in temperature of the low-side transistors can be restricted during the active clamp operation.

(5) The semiconductor device according to (3) or (4) in which the widths of the low-side transistor regions arranged on the external periphery are equal.

With the configuration, the heat radiation property of the low-side transistor regions arranged on the external periphery can be made uniform, thereby enhancing uniformity of the temperature. Thus, an increase in temperature in the low-side transistor regions can be restricted during the active clamp operation.

(6) The semiconductor device according to (4) or (5) in which the short side of the low-side transistor region on both sides of which the high-side transistor regions are present is shorter than the short side of the low-side transistor region only on either side of which the high-side transistor region is present.

With the configuration, a difference in temperature can be reduced between the low-side transistor region on both sides of which the high-side transistor regions are arranged and the low-side transistor region only on either side of which the high-side transistor region is arranged.

(7) The semiconductor device according to any of (1) to (6) in which the group of low-side transistors and the group of high-side transistors are configured of NMOS transistors in which a N-type drain region is formed on a P-type semiconductor layer isolated from a support substrate, and the group of low-side transistors is not surrounded by the trenches.

With the configuration, the heat radiation property of the low-side transistors can be enhanced.

(8) The semiconductor device according to any of (1) to (7) in which the group of low-side transistors and the group of high-side transistors are configured of IGBTs in which a P-type hole injection region is formed on a P-type semiconductor layer isolated from a support substrate, and the group of low-side transistors is not surrounded by the trenches.

With the configuration, the heat radiation property of the low-side transistors can be enhanced.

(9) The semiconductor device according to (1) to (8) in which thermal destruction energy of the group of low-side transistors is higher than thermal destruction energy of the group of high-side transistors.

With the configuration, the thermal destruction energy of the low-side transistors can be increased while restricting an increase in chip size of the drive circuit.

(10) The semiconductor device according to any of (1) to (9) in which the high-side transistor region is configured of a transistor with a breakdown voltage of 30 V or more, and the low-side transistor region is configured of a transistor with a breakdown voltage of 30 V or more.

REFERENCE SIGNS LIST

1 STI (Shallow Trench Isolation)
2, 3 P-well layer
4, 5 N-type drain drift layer
6, 7 Source
8, 9 Drain
10, 11 P Layer connected to P-well layer
12, 13 Gate oxide film
14, 15 Gate
16 Contact connected to wiring layer
17, 20 Source electrode
18, 21 Drain electrode
19, 22 Gate electrode
31 Si support substrate
32 $SiO_2$ layer
33 P-type semiconductor layer
41 Trench
101 High-side NMOS transistor
102 Low-side NMOS transistor
200 Semiconductor device
201 Current drive circuit
202 Electromagnetic load
203 Switch
204 High-side transistor
205 Resistor
206 High-side gate driver
207 Low-side transistor
208 Resistor 209 Low-side gate driver
210 Active clamp circuit
211 Power supply

The invention claimed is:

1. A semiconductor device comprising:
    a semiconductor substrate;
    a high-side transistor formed in a first region on the surface of the semiconductor substrate;
    a trench surrounding the high-side transistor;
    a first insulator embedding the trench; and
    a low-side transistor formed in a second region on the surface of the semiconductor substrate around the trench,
    wherein the side face connecting the second region forming the low-side transistor therein and the backside of the semiconductor substrate is exposed.

2. A semiconductor device comprising:
    a semiconductor substrate;
    a high-side transistor formed in a first region on the surface of the semiconductor substrate;
    a trench surrounding the high-side transistor;
    a first insulator embedding the trench; and
    a low-side transistor formed in a second region on the surface of the semiconductor substrate around the trench,
    wherein the total area of the second region forming the low-side transistor therein is larger than the total area of the first region forming the high-side transistor therein.

3. The semiconductor device according to claim 1,
    wherein the low-side transistor is arranged to surround the trench.

4. The semiconductor device according to claim 1,
    wherein the first region is quadrangular, and the low-side transistors are formed in two region adjacent to a pair of opposite sides of the first region.

5. The semiconductor device according to claim 4,
    wherein the widths of the two regions adjacent to the pair of opposite sides of the first region, respectively, are equal in a direction in which the first region and the second regions are arranged.

6. The semiconductor device according to claim 1,
    wherein the high-side transistors are formed in at least two mutually-separated regions,
    the trenches surround the regions forming the high-side transistors therein, respectively, and
    the distance between the adjacent trenches is shorter than the distance between the trench and the end of the semiconductor substrate in a direction in which the regions forming the high-side transistors therein are arranged.

7. The semiconductor device according to claim 1,
    wherein the semiconductor substrate is configured in which a support substrate, a second insulator, and a P-type semiconductor are laminated, and
    the first insulator contacts with the second insulator.

8. The semiconductor device according to claim 1,
    wherein the low-side transistor and the high-side transistor are NMOS transistors or IGBTs.

9. The semiconductor device according to claim 1,
    wherein thermal destruction energy of the low-side transistor is higher than thermal destruction energy of the high-side transistor.

10. The semiconductor device according to claim 1,
    wherein the low-side transistor and the high-side transistor have a breakdown voltage of 30 V or more.

* * * * *